(12) United States Patent
Anderson et al.

(10) Patent No.: US 8,580,601 B2
(45) Date of Patent: Nov. 12, 2013

(54) PIXEL SENSOR CELL WITH A DUAL WORK FUNCTION GATE ELECTRODE

(75) Inventors: Brent A. Anderson, Jericho, VT (US); Andres Bryant, Burlington, VT (US); William F. Clark, Jr., Essex Junction, VT (US); John Joseph Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/571,986

(22) Filed: Aug. 10, 2012

(65) Prior Publication Data
US 2012/0301990 A1    Nov. 29, 2012

Related U.S. Application Data

(62) Division of application No. 13/029,670, filed on Feb. 17, 2011, now Pat. No. 8,299,505.

(51) Int. Cl.
*H01L 21/00* (2006.01)

(52) U.S. Cl.
USPC ............................................ 438/69; 438/588

(58) Field of Classification Search
USPC .......................... 438/57, 73, 585–589, 69–72
See application file for complete search history.

(56) References Cited

U.S. PATENT DOCUMENTS

| 6,033,963 | A  | * | 3/2000  | Huang et al. ............. 438/303 |
| 6,281,064 | B1 |   | 8/2001  | Mandelman et al. |
| 6,333,220 | B1 |   | 12/2001 | Mandelman et al. |
| 6,335,248 | B1 |   | 1/2002  | Mandelman et al. |
| 6,432,787 | B1 |   | 8/2002  | Mandelman et al. |
| 6,855,604 | B2 |   | 2/2005  | Lee |
| 7,521,280 | B1 |   | 4/2009  | Anderson et al. |
| 7,675,097 | B2 |   | 3/2010  | Adkisson et al. |
| 7,928,488 | B2 | * | 4/2011  | Park ......................... 257/294 |
| 7,955,924 | B2 | * | 6/2011  | Song et al. ............... 438/228 |
| 2002/0028559 | A1 |   | 3/2002  | Mandelman et al. |
| 2004/0262651 | A1 | * | 12/2004 | Mouli ....................... 257/290 |

OTHER PUBLICATIONS

USPTO, Notice of Allowance issued in related U.S. Appl. No. 13/029,670 dated Jul. 13, 2012.
USPTO, Office Action issued in related U.S. Appl. No. 13/029,670 dated Mar. 5, 2012.

* cited by examiner

*Primary Examiner* — Richard Booth
(74) *Attorney, Agent, or Firm* — Wood, Herron & Evans LLP; Anthony J. Canale

(57) ABSTRACT

Pixel sensor cells, methods of fabricating pixel sensor cells, and design structures for a pixel sensor cell. The pixel sensor cell has a gate structure that includes a gate dielectric and a gate electrode on the gate dielectric. The gate electrode includes a layer with first and second sections that have a juxtaposed relationship on the gate dielectric. The second section of the gate electrode is comprised of a conductor, such as doped polysilicon or a metal. The first section of the gate electrode is comprised of a metal having a higher work function than the conductor comprising the second section so that the gate structure has an asymmetric threshold voltage.

19 Claims, 8 Drawing Sheets

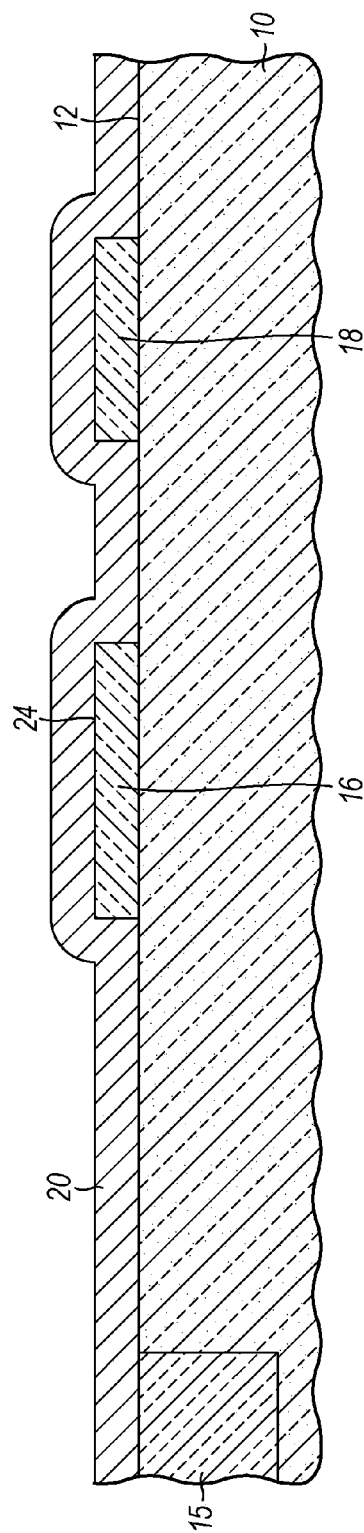
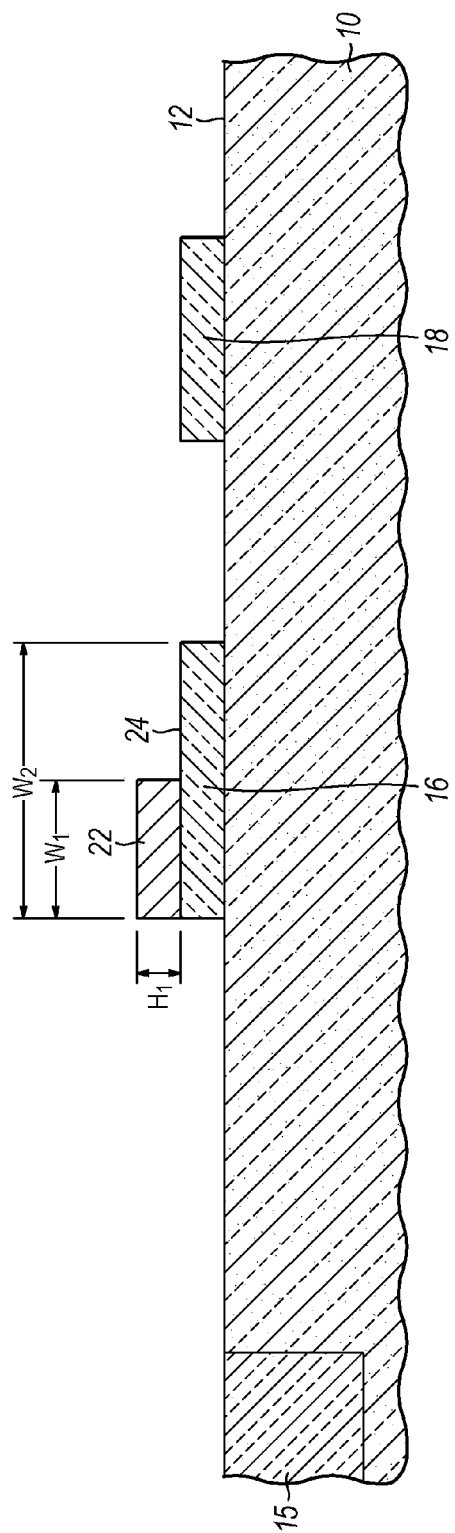

PIXEL SENSOR CELL WITH A DUAL WORK FUNCTION GATE ELECTRODE

CROSS-REFERENCE TO RELATED APPLICATIONS

This application is a divisional of application Ser. No. 13/029,670, filed Feb. 17, 2011, which is hereby incorporated by reference herein in its entirety.

BACKGROUND

The invention relates generally to semiconductor device fabrication and, in particular, to pixel sensor cells and methods of fabricating pixel sensor cells, as well as design structures for a pixel sensor cell.

Digital cameras and optical imaging devices, such as web cameras and cell phone cameras, may employ (CMOS) pixel sensor cells to convert a visual image to digital data that may be represented by a picture. Each pixel sensor cell includes multiple photodiodes each masked by an optical filter with a different passband representing a range of wavelengths transmitted with minimal attenuation. Each photodiode converts the incident light into charge carriers that are collected in a charge collection well. Periodically, charge is transferred from the charge collection well to a floating diffusion region of the pixel sensor cell and temporarily stored. During a read out of the pixel sensor cell, a read circuit detects the amount of stored charge and converts the stored charge into an output voltage from the pixel sensor cell.

Improved pixel sensor cells and fabrication methods for pixel sensor cells, as well as design structures for pixel sensor cells, are needed.

BRIEF SUMMARY

In an embodiment of the invention, a method is provided for fabricating a pixel sensor cell. The method includes forming a gate dielectric for a gate structure of the pixel sensor cell, forming a first section of a gate electrode on the gate dielectric, and forming a second section of the gate electrode on the gate dielectric. The first and second sections of the gate electrode have a juxtaposed relationship to define a layer of the gate electrode. The second section of the gate electrode is comprised of a conductor. The first section of the gate electrode is comprised of a metal having a higher work function than the conductor comprising the second section of the gate electrode so that the gate structure has an asymmetric threshold voltage.

In an embodiment of the invention, a pixel sensor cell includes a photosensing element, a floating diffusion region, and a gate structure configured to control carrier transfer from the photosensing element to the floating diffusion region. The gate structure includes a gate electrode and a gate dielectric. The gate electrode includes a layer comprised of first and second sections that have a juxtaposed relationship on the gate dielectric. The second section of the gate electrode is comprised of a conductor, such as doped polysilicon or a metal. The first section of the gate electrode is comprised of a metal having a higher work function than the conductor comprising the second section of the gate electrode so that the gate structure has an asymmetric threshold voltage.

In another embodiment, a hardware description language (HDL) design structure is encoded on a machine-readable data storage medium. The HDL design structure comprises elements that, when processed in a computer-aided design system, generates a machine-executable representation of a pixel sensor cell. The HDL design structure comprises a photosensing element, a floating diffusion region, and a gate structure configured to control carrier transfer from the photosensing element to the floating diffusion region. The gate structure includes a gate electrode and a gate dielectric. The gate electrode includes a layer comprised of first and second sections that have a juxtaposed relationship on the gate dielectric. The second section of the gate electrode is comprised of a conductor, such as doped polysilicon or a metal. The first section of the gate electrode is comprised of a metal having a higher work function than the conductor comprising the second section of the gate electrode so that the gate structure has an asymmetric threshold voltage. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 1-7 are cross-sectional views of a portion of a substrate at successive fabrication stages of a processing method for fabricating a pixel sensor cell in accordance with an embodiment of the invention.

DETAILED DESCRIPTION

Embodiments of the invention are generally directed to a pixel sensor cell that includes a transfer gate with an asymmetric threshold voltage, $V_t$. The asymmetry in the threshold voltage may be produced by using a gate structure for the transfer gate that incorporates a high-K gate dielectric and a gate electrode with materials having two different effective work functions. For example, the gate electrode may include a plurality of metal sections arranged in a juxtaposed arrangement as an electrode layer or, alternatively, at least one metal section juxtaposed with a polysilicon section in an electrode layer. The divergent work functions for the different sections of the gate electrode promote the ability to modulate the threshold voltage across the gate structure. The gate electrode section of higher work function exhibits a higher threshold voltage and is located adjacent to the photosensitive region (e.g., a pinned photodiode) of the pixel sensor cell. The gate electrode section of lower work function exhibits a lower threshold voltage and is adjacent to the floating diffusion region of the pixel sensor cell. The lateral modulation of the threshold voltage optimizes the channel potential with a built-in electric field to sweep electrons toward the floating diffusion region and to avoid spillback to the photosensitive region.

Embodiments of the invention are described herein in terms of a "pixel sensor cell". It is noted that the term "pixel sensor cell" is used to generally refer to any type of sensor cell that is capable of converting incident electromagnetic radiation into an electrical signal. An example of a pixel sensor cell according to the invention includes a pixel sensor cell that is capable of detecting optical wavelengths of electromagnetic radiation and is commonly referred to as an "image sensor". An image sensor fabricated using CMOS technology is commonly referred to as a "CMOS image sensor".

Figure 1:
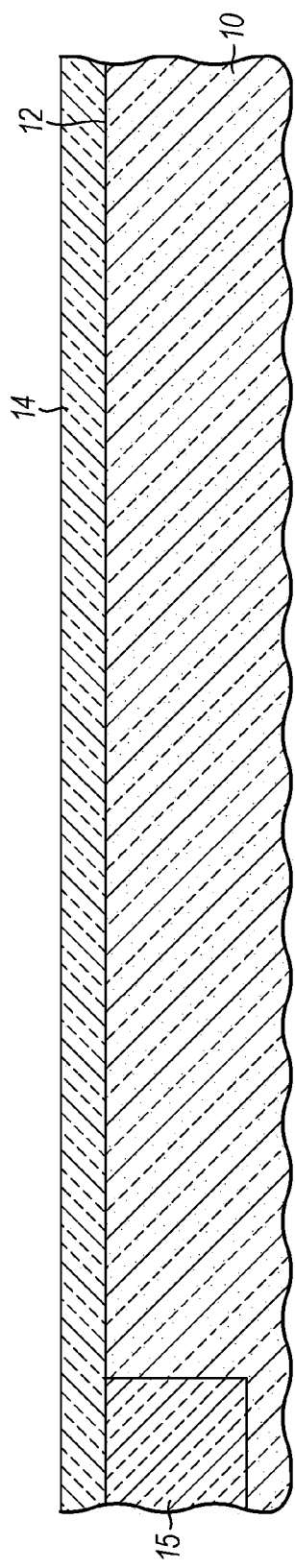

With reference to FIG. 1 and in accordance with an embodiment of the invention, a semiconductor layer 10 is comprised of a semiconductor material that a person having ordinary skill in the art would recognize as suitable for forming an integrated circuit. For example, the semiconductor layer 10 may be comprised of a monocrystalline silicon-containing material, such as bulk single crystal silicon or a silicon-on-insulator (SOI) layer. The semiconductor material constituting semiconductor layer 10 may be lightly doped with an impurity to alter its electrical properties. Specifically, the semiconductor layer 10 may be lightly doped with a concentration of an n-type impurity species (e.g., arsenic) to render it initially lightly doped n-type ($n^-$) semiconductor material or lightly doped with a concentration of a p-type impurity species (e.g., boron or indium) to render it initially lightly doped p-type ($p^-$) semiconductor material. The semiconductor layer 10 may be an epitaxial layer grown on a bulk substrate of higher doping (e.g., $p^+$) and the light-doping state of semiconductor layer 10 may result from doping during epitaxial growth.

An isolation structure 15 may be formed in the semiconductor layer 10 by a shallow trench isolation (STI) technique that relies on conventional lithography and dry etching processes to define trenches in semiconductor layer 10, fills the trenches with portions of a dielectric material, and planarizes the dielectric material to the top surface 12 of semiconductor layer 10 using a chemical mechanical polishing (CMP) process. The dielectric material contained in isolation structure 15 may be an oxide, such as densified tetraethylorthosilicate (TEOS) deposited by thermal chemical vapor deposition (CVD) or a high-density plasma (HDP) oxide deposited with plasma assistance. The isolation structure 15, which is formed proximate to the invented location of the pixel sensor cell, functions to isolate the cell from adjacent pixel sensor cells of similar construction.

A dielectric layer 14 is formed on a top surface 12 of the semiconductor layer 10. The dielectric layer 14 will eventually contribute to formation of gate dielectrics for the transfer and reset transistors. The dielectric layer 14 may be comprised of a high dielectric constant (high-k) dielectric material characterized by a relatively high dielectric constant (e.g., permittivity) and may have a layer thickness ranging from 1 nm to 15 nm. As used herein, candidate high-k dielectrics are considered to have a dielectric constant greater than 10 and, preferably, in a range of 10 to 100. Air, which is an accepted reference point for values of relative permittivity or dielectric constant, has a dielectric constant of approximately unity. Representative high-k dielectric materials for dielectric layer 14 include, but are not limited to, hafnium-based dielectric materials like hafnium oxide ($HfO_2$), hafnium silicate (HfSiO), or nitrided hafnium silicate (HfSiON), aluminum oxide ($Al_2O_3$), lanthanum oxide ($La_2O_3$), titanium dioxide ($TiO_2$), tantalum oxide ($Ta_2O_5$), zirconium oxide ($ZrO_2$), zirconium silicon oxide (ZrSiO), yttrium oxide ($Y_2O_3$), strontium oxide (SrO), or strontium titanium oxide (SrTiO), mixtures thereof, or layered stacks of these and other dielectric materials. These types of high-k dielectric materials may be deposited by atomic layer deposition (ALD), CVD, or another conventional deposition technology. Use of a high-k dielectric in a gate structure of a transistor has been observed to significantly reduce leakage currents, which reduces power consumption for the transistor.

Figure 2:
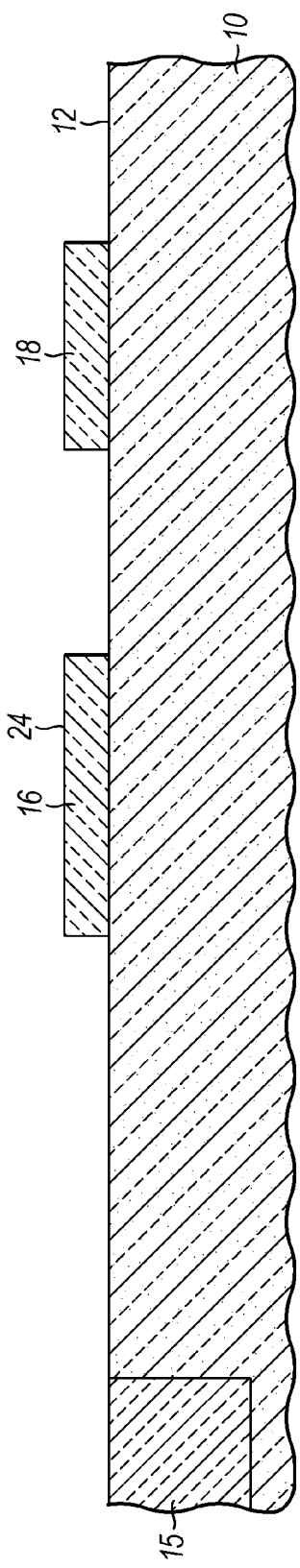

With reference to FIG. 2 in which like reference numerals refer to like features in FIG. 1 and at a subsequent fabrication stage, the dielectric layer 14 is patterned with a lithography and etching process to form gate dielectrics 16, 18 at the intended locations for the gate structures of the transfer and reset transistors. To form gate dielectric 16, 18, a resist (not shown) is applied on a top surface of the dielectric layer 14 by a spin coating process, pre-baked, exposed to a radiation projected through a photomask, baked after exposure, and developed with a chemical developer to form a mask that includes islands coinciding spatially with the intended locations of gate dielectrics 16, 18. The pattern is transferred from the mask to the dielectric layer 14 with a wet etching process or dry etching process, such as a reactive-ion etching (RIE) or a plasma etching process. Dielectric material in dielectric layer 14 that is unprotected by the mask islands is removed by the etching process to define the gate dielectrics 16, 18. The etching process relies on an etchant chemistry that removes the dielectric material of the dielectric layer 14 selective to (i.e., at a higher etch rate than) the material constituting the semiconductor layer 10 and preferably stops on the top surface 12 of the semiconductor layer 10. The resist is removed by ashing or solvent stripping and a conventional cleaning process is applied.

With reference to FIG. 3 in which like reference numerals refer to like features in FIG. 2 and at a subsequent fabrication stage, a layer 20 of a conductor is formed as a conformal additive layer directly on the top surface 12 of the semiconductor layer 10 and the gate dielectrics 16, 18. The conductor layer 20 may have a layer thickness ranging from 1 nm to 5 nm. The conductor layer 20 may be comprised of a material that includes a transition metal. In various embodiments, the transition metal may be selected from tungsten (W), tantalum (Ta), titanium nitride (TiN), zirconium nitride (ZrN), hafnium nitride (HfN), vanadium nitride (VN), niobium nitride (NbN), tantalum nitride (TaN), tungsten nitride (WN), titanium aluminum nitride (TiAlN), tantalum carbide (TaC), tantalum magnesium carbide (TaMgC), tantalum carbonitride (TaCN), a combination or an alloy thereof, or analogous materials recognized by a person having ordinary skill in the art. The metal constituting conductor layer 20 may be deposited by CVD, ALD, physical vapor deposition (PVD), etc.

Figure 4A:
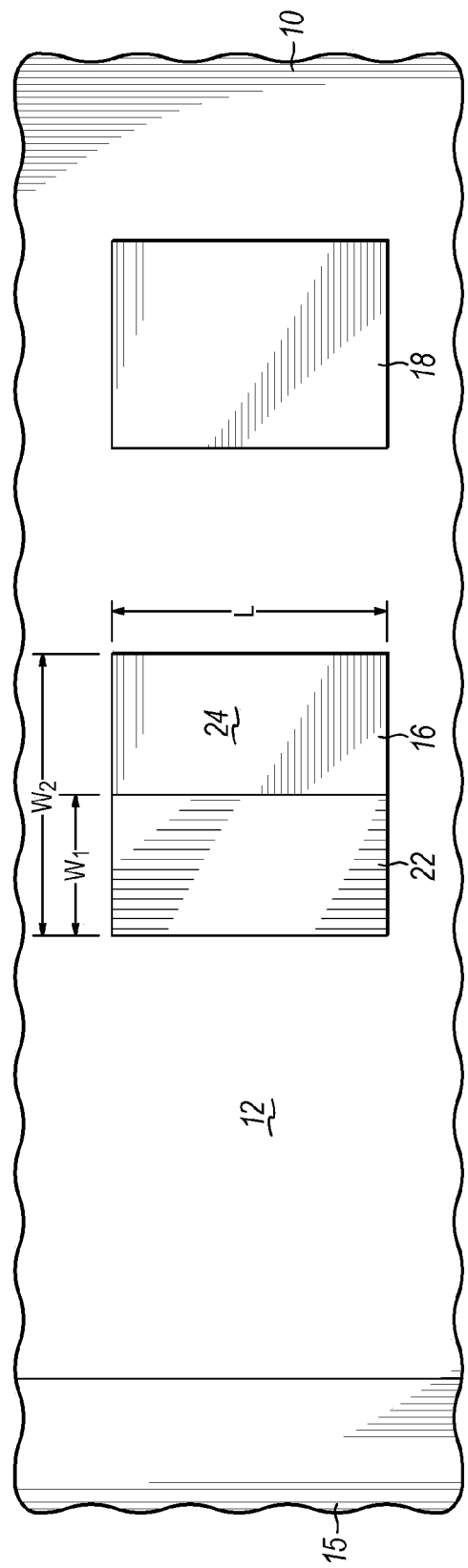
FIG. 4A is a top view of the substrate portion at the fabrication stage of FIG. 4.

With reference to FIGS. 4 and 4A in which like reference numerals refer to like features in FIG. 3 and at a subsequent fabrication stage, a section 22 of a gate electrode 40 (FIG. 7) for a transfer gate is formed from the conductor layer 20. To that end, a patterned etch mask (not shown) is applied on a top surface of the conductor layer 20. To that end, a resist (not shown) is applied on a top surface of the conductor layer 20 by a spin coating process. The resist is pre-baked, exposed to a radiation projected through a photomask, baked after exposure, and developed with a chemical developer to form an etch mask. The etch mask includes an island of resist at the intended locations of the gate electrode section 22. In particular, the island of resist used to form the gate electrode section 22 has a surface area that is smaller than the surface area of the top surface 24 of gate dielectric 16.

An anisotropic etching process removes the conductor layer 20 from surface areas that are unprotected by the etch mask. The process may be a dry etching process, such as RIE or a plasma etching process, that relies on an etchant chemistry that removes the material of the conductor layer 20 selective to (i.e., at a higher etch rate than) the materials constituting the semiconductor layer 10 and the gate dielectrics 16, 18. The etching process preferably stops on the top surface 12 of the semiconductor layer 10. The resist is stripped and a conventional cleaning process is applied.

Because of the masking, the gate electrode section 22 for the transfer gate is characterized by a width, $W_1$, which is narrower than the width, $W_2$, of the gate dielectric 16. The gate electrode section 22 for the transfer gate is characterized by a length, L, which may be equal to the original length of the gate dielectric 16. The gate electrode section 22 directly contacts the top surface 24 of the gate dielectric 16 and has a physical layer thickness, $H_1$, that may be approximately equal to the physical layer thickness of the conductor layer 20.

Figure 5:
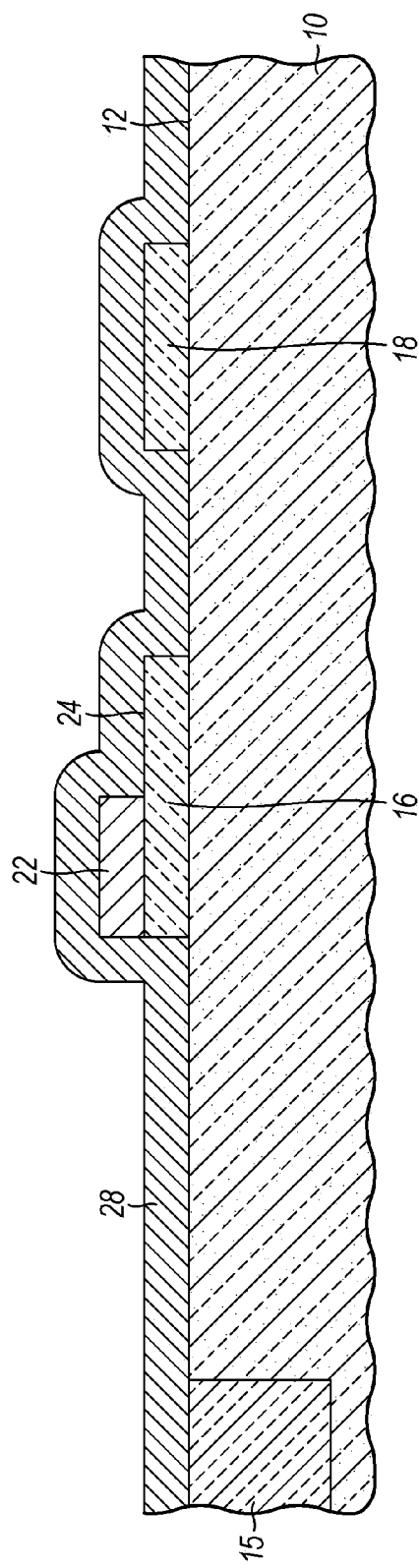

With reference to FIG. 5 in which like reference numerals refer to like features in FIG. 4 and at a subsequent fabrication stage, a layer 28 of a conductor is formed as a conformal additive layer directly on the top surface 12 of the semiconductor layer 10, the exposed top surface 24 of gate dielectric 16, and the gate electrode section 22. The conductor layer 28 may have a layer thickness ranging from 1 nm to 5 nm, and the layer thickness may be matched to the layer thickness of conductor layer 20. The conductor layer 28 may be comprised of the same metals as conductor layer 20, namely W, Ta, TiN, ZrN, HfN, VN, NbN, TaN, WN, TiAlN, TaC, TaMgC, TaCN, a combination or an alloy thereof, or analogous materials recognized by a person having ordinary skill in the art, which may be deposited by CVD, ALD, PVD, etc. However, the work function of the metal selected to comprise conductor layer 28 differs from the work function of the metal selected to comprise conductor layer 20. In particular, the work function of the metal selected for conductor layer 28 may be selected to be smaller than the work function of the metal selected to comprise conductor layer 20.

Figure 6:
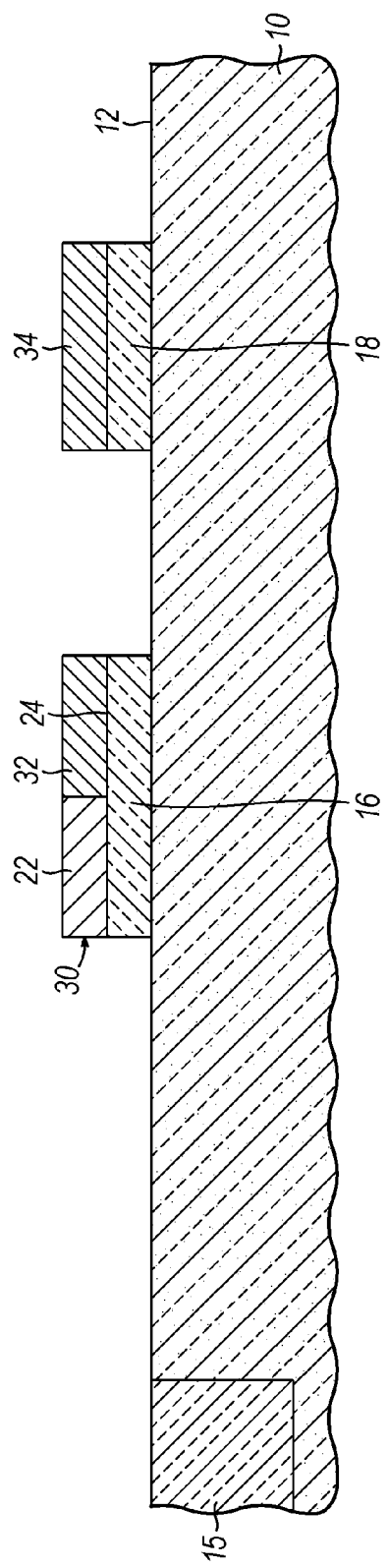
Figure 6A:
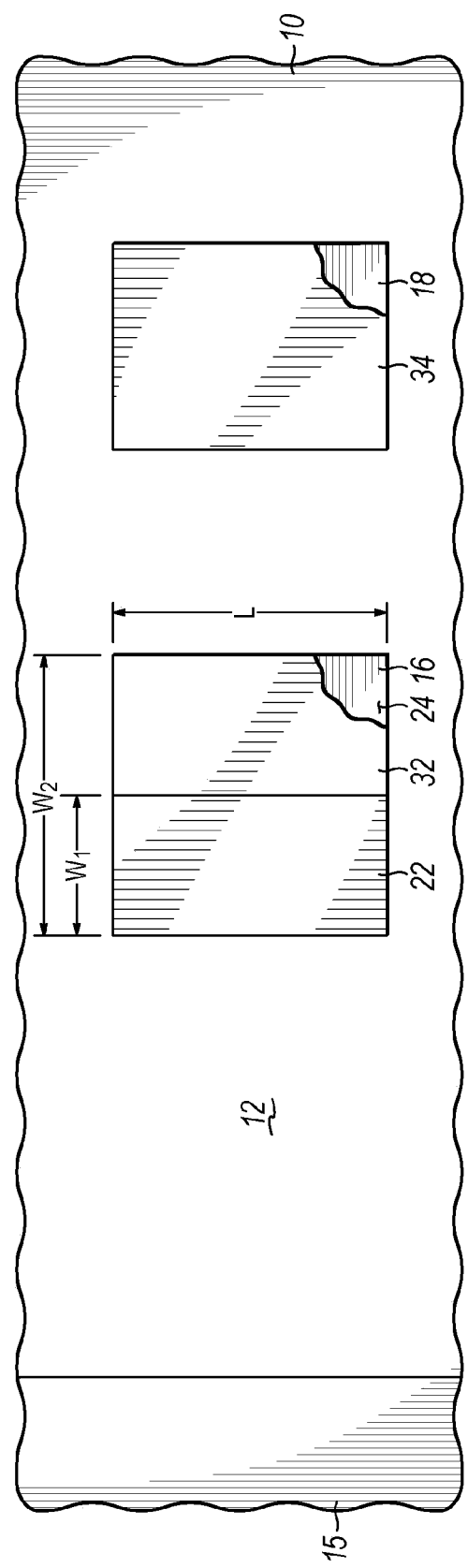
FIG. 6A is a top view of the substrate portion at the fabrication stage of FIG. 6.

With reference to FIGS. 6, 6A in which like reference numerals refer to like features in FIG. 5 and at a subsequent fabrication stage, a section 32 of the gate electrode 40 for the transfer gate and a section 34 of a gate electrode 42 for a reset gate are formed from the conductor layer 28. To that end, a patterned etch mask (not shown) is applied on a top surface of the conductor layer 28. To that end, a resist (not shown) is applied on a top surface of the conductor layer 28 by a spin coating process. The resist is pre-baked, exposed to a radiation projected through a photomask, baked after exposure, and developed with a chemical developer to form an etch mask. The etch mask includes islands of resist at the intended locations of the gate electrode sections 32, 34. In particular, the island of resist used to form the gate electrode section 32 has a surface area that is smaller than the surface area of the gate dielectric 16 and the island of resist used to form the gate electrode section 34 has a surface area that is commensurate in size with the surface area of the gate dielectric 18. The surface area of the island of resist used to form the gate electrode section 32 is approximately equal to the exposed surface area of the top surface 24 of the gate dielectric 16 that is not occupied by gate electrode section 22. The island of resist used to form the gate electrode section 34 has a surface area that is commensurate in size with the surface area of the gate dielectric 18.

An anisotropic etching process removes the conductor layer 28 from surface areas on the top surface 12 of dielectric layer 10 that are unprotected by the etch mask. The process may be a dry etching process, such as RIE or a plasma etching process, that relies on an etchant chemistry that removes the material of the conductor layer 28 selective to (i.e., at a higher etch rate than) the materials constituting the semiconductor layer 10 and the gate electrode section 22. The etching process preferably stops on the top surface 12 of the semiconductor layer 10. The resist is stripped and a conventional cleaning process is applied.

The gate electrode section 32 for gate electrode 40 of the transfer gate is characterized by a width given by the difference between width, $W_1$, and width, $W_2$. The gate electrode section 32 is characterized by a length, L, which may be equal to the original length of the gate dielectric 16 and the length of the gate electrode section 22. The gate electrode section 32 directly contacts the top surface 24 of the gate dielectric 16 and has a juxtaposed relationship with the gate electrode section 22 to define a layer 30 of the gate electrode 40.

A person having ordinary skill in the art will appreciate that, while the gate electrode section 32 is formed after gate electrode section 22 in the representative embodiment, the gate electrode section 32 may be formed before gate electrode section 22.

The gate electrode section 34 for gate electrode 42 of the reset gate has a uniform layer thickness across its length and width, and directly contacts a top surface of the gate dielectric 18. Because of the masking, the dimensions of the gate electrode section 34 are commensurate with the dimensions of the gate dielectric 18.

Figure 7:
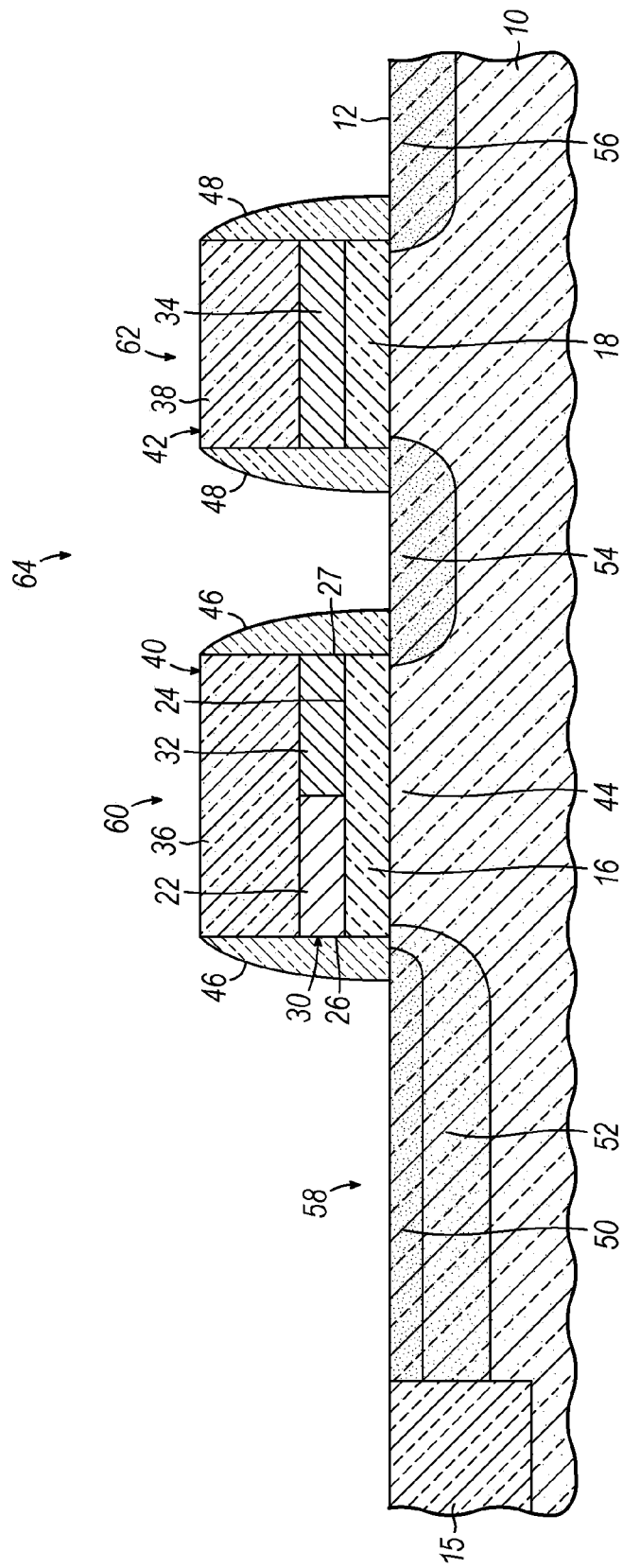

With reference to FIG. 7 in which like reference numerals refer to like features in FIG. 6 and at a subsequent fabrication stage, the gate electrodes 40, 42 are completed to respectively form a gate structure 60 for the transfer gate of a pixel sensor cell 64 and a gate structure 62 for the reset gate of the pixel sensor cell 64. Gate electrode sections 36, 38 are comprised of a different type of material than the materials of gate electrode sections 22, 32, 34. In particular, the gate electrode sections 36, 38 are comprised of a material having a lower work function than the respective materials comprising any of the gate electrode sections 22, 32, 34. In one embodiment, the gate electrode sections 36, 38 are comprised of polysilicon, which is characterized by a lower work function than the materials of the gate electrode sections 22, 32, 34. The gate electrode sections 36, 38 may be formed by depositing a blanket layer of polysilicon by CVD using either silane or disilane as a silicon source, forming a patterned resist mask (not shown) on the blanket polysilicon layer, and using an anisotropic etching process to remove portions of the blanket polysilicon layer not masked by the patterned resist mask.

The gate structure 60 of the transfer gate includes the gate dielectric 16 and the gate electrode 40. Sidewalls 26, 27 of the gate electrode sections 22, 32, 36 of gate electrode 40 are aligned with the underlying sidewalls of the gate dielectric 16 to form a layer stack. The gate dielectric 16 is interposed between the gate electrode 40 and the top surface 12 of the semiconductor layer 10 and, in particular, is interposed between the gate electrode 40 and a planar channel region 44 in the semiconductor layer 10 that is controlled by the transfer gate. The gate structure 60 overlies the channel region 44 and is electrically connected with one or more contacts (not shown).

Sidewall spacers 46, 48 are formed on the gate electrodes 40, 42 by a conventional spacer formation process. The sidewall spacers 46, 48 may be formed by depositing a conformal layer of an electrically insulating material, such as about ten (10) nanometers to about fifty (50) nanometers of $Si_3N_4$ deposited by CVD, and anisotropic etching the conformal layer to preferentially remove the electrically insulating material from horizontal surfaces. The electrical conductivity of dielectric material in the sidewall spacers 46, 48 is substantially less than the electrical conductivity of the conductor in the gate electrodes 40, 42. In an alternative embodiment, the sidewall spacers 46, 48 may be omitted.

The pixel sensor cell 64 is then completed by forming a charge collection well 52, a pinning layer 50 for the charge collection well 52, a floating diffusion region 54, and a contact region 56 in the semiconductor layer 10. The sidewall 26 of gate electrode 40 is proximate or adjacent to the charge collection well 52 and pinning layer 50. The gate electrode sections 22, 32 have a juxtaposed arrangement in gate electrode layer 30 contained in a plane that is parallel to the top surface 12 of the dielectric layer 10. The gate electrode section 32 of gate electrode 40 is separated from sidewall 26 by the width, $W_1$, of the gate electrode section 22. The sidewall 27 of gate electrode 40 is separated from sidewall 26 by the width, $W_2$, of gate electrode sections 22, 32 in the gate electrode layer 30.

The pinning layer 50 is disposed vertically between the charge collection well 52 and the top surface 12 of the semiconductor layer 10 and laterally between the channel region 44 of the gate structure 60 and the isolation structure 15. The charge collection well 52 is spaced from the top surface 12 by the intervening pinning layer 50. The floating diffusion region 54 is separated laterally from the charge collection well 52 by the channel region 44 of the gate structure 60 and is suitably close to the top surface 12 for establishing electrical connection with one or more contacts (not shown).

The charge collection well 52 of pixel sensor cell 64 has an opposite conductivity type to the semiconductor layer 10. The charge collection well 52 serves as a source for the transfer gate that includes gate structure 60. The charge collection well 52 is formed using an implantation mask and an ion implantation process to introduce a suitable impurity species as a dopant into the semiconductor layer 10 at a location adjacent to the gate electrode 40. The implantation mask may be formed by applying a photoresist layer with a spin coating process, exposing the photoresist to radiation imaged through a photomask, and developing the exposed photoresist to provide a window at the intended location in semiconductor layer 10 for the charge collection well 52. The edge of the window coincides with the edge of the sidewall spacer 46 or, if the sidewall spacer 46 is omitted, the window edge coincides with the sidewall 26 of the gate electrode 40.

A conventional implantation process is used to generate and implant energetic ions of the impurity species. The charge collection well 52 may be formed with multiple implantations at different kinetic energies that collectively provide a doped region in the semiconductor material of semiconductor layer 10 characterized by an appropriate dopant concentration and dopant depth distribution. The doses and projected ranges of the impurity species are selected to supply a dopant concentration suitable for the photodiode region, such as a light dopant concentration. The thickness of the ion implantation mask is selected to stop the energetic ions outside of the window in the photoresist. The conductivity type of the dopant used to form the photodiode region is opposite to the conductivity type of the dopant used to form the photodiode pinning layer. In one embodiment, the impurity species is an element from Group V of the Periodic Table (e.g., phosphorus, arsenic or antimony) effective to act as a dopant to impart an n-type conductivity in the semiconductor material of the semiconductor layer 10.

The pinning layer 50 of pixel sensor cell 64 has the same conductivity type as the semiconductor layer 10 but a higher dopant concentration and an opposite conductivity type than the charge collection well 52. The pinning layer 50 may be formed using an ion implantation mask and an ion implantation process to introduce a suitable impurity species as a dopant into the semiconductor layer 10. The same implantation mask used to form the charge collection well 52 may be used to form the pinning layer 50 or, alternatively, a new implantation mask may be applied. Energetic ions of the impurity species are generated and implanted using a conventional implantation process. The ion kinetic energy is selected such that the projected range of the ions is at a relatively shallow depth beneath the top surface 12 of the semiconductor layer 10 and between the charge collection well 52 and the top surface 12. The thickness of the ion implantation mask is selected to stop the energetic ions outside of the window in the photoresist. In one embodiment, the impurity species is an element in Group III of the Periodic Table (e.g., boron or indium) effective to act as a dopant to impart a p-type conductivity in the semiconductor material of the semiconductor layer 10. The dose of the impurity species is selected to supply a dopant concentration suitable for the pinning layer 50, such as a moderate dopant concentration, and higher than the concentration in the semiconductor layer 10.

The floating diffusion region 54 and a contact region 56 of pixel sensor cell 64 have an opposite conductivity type to the semiconductor layer 10 and the same conductivity type as the charge collection well 52. The floating diffusion region 54 and contact region 56 are located on opposite sides of the gate electrode 42 for the gate structure 62 and may be formed using an ion implantation mask and an ion implantation process to introduce a suitable impurity species as a dopant into the semiconductor layer 10. The floating diffusion region 54 serves as a drain for the transfer gate that includes gate structure 60 and as a source for reset gate that includes the gate structure 62. The gate structure 62 for the reset gate includes the gate dielectric 18 and the gate electrode 42 and overlies another planar channel in the semiconductor layer 10 laterally between the floating diffusion region 54 and the contact region 56.

The floating diffusion region 54 and contact region 56 may be concurrently formed using an ion implantation mask and an ion implantation process to introduce a suitable impurity species as a dopant into the semiconductor layer 10. To that end, an implantation mask is prepared, as described above for the implantation mask used to form the charge collection well 52. However, the implantation mask has windows that coincide with the intended locations for the floating diffusion region 54 and contact region 56. Energetic ions of the impurity species are generated and implanted using a conventional implantation process. The ion kinetic energy is selected such that the projected range of the ions is at a relatively shallow depth beneath the top surface 12 of the semiconductor layer 10. The thickness of the ion implantation mask is selected to stop the energetic ions outside of the window in the photoresist. In one embodiment, the impurity species in the ions is an element in Group V of the Periodic Table (e.g., phosphorus, arsenic, or antimony) effective to act as a dopant to impart an n-type conductivity in the semiconductor material of the semiconductor layer 10. The dose of the impurity species is selected to supply a dopant concentration suitable for a contacted source and drain of an FET device.

The material constituting the gate electrode sections 36, 38 may be doped to increase their electrical conductivity by the one of the implantations used to dope the charge collection well 52, the pinning layer 50, or the floating diffusion region 54.

One or more high-temperature anneals may be required to electrically activate the various implanted impurity species, to alleviate implantation damage, and to re-distribute the impurity species within the doped regions. Alternatively, the doped regions may be formed by dopant diffusion inward from the top surface 12 of the semiconductor layer 10.

The charge collection well 52 and the nearby region of the semiconductor layer 10, which is oppositely-doped, collectively constitute a photosensing element in the representative form of a pinned photodiode 58. Electron-hole pairs are generated within a depletion region of the photodiode 58 when impinged by incident light, which is typically filtered with a color filter and focused onto the photosensing element by a lens. The number of generated electron-hole pairs is proportional to the number of photons. Photocarriers of one charge type, either electrons or holes, are accumulated and stored in the charge collection well 52. The photodiode 58 of pixel sensor cell 64 is "pinned" because the potential in the photodiode 58 is pinned to a constant value when the photodiode 58 is fully depleted. It should be understood, however, that the pixel sensor cell 64 may include a photogate, a photoconductor, or another type of photon-to-charge converting device, as a substitute for the pinned photodiode 58.

When voltage is applied to the gate electrode 40 of gate structure 60, the stored photocarriers are transferred from the charge collection well 52 through the channel region 44 to the floating diffusion region 54 of pixel sensor cell 64. The floating diffusion region 54 may be covered by an opaque light shield (not shown) to block light exposure. The floating diffusion region 54 stores the photocarriers as electrical charge as data until a read circuit detects the amount of stored charge and converts the charge to a pixel output voltage. The gate structure 62 is used to set the floating diffusion region 54 to a known state before charge is transferred from the charge collection well 52 to the floating diffusion region 54.

The gate electrode sections 22, 32 of gate electrode 40 provide the gate structure 60 of transfer gate with an asymmetric threshold voltage in which the portion of the gate structure 60 on the source side (i.e., the side nearest to the charge collection well 52 and including gate electrode section 22) has a higher threshold voltage and the portion of the gate structure 60 on the drain side (i.e., the side more distant from the charge collection well 52 and including gate electrode section 32) has a lower threshold voltage. The threshold voltage asymmetry, which arises from the difference in work function between the metals used to construct the different gate electrode sections 22, 32, improves the efficiency of the gate structure 60 of the transfer gate because charge can be transferred from the charge collection well 52 to the floating diffusion region 54 without spilling back some fraction of the charge into the charge collection well 52 when the gate electrode 40 is switched off. The improved efficiency reduces lag and noise for the pixel sensor cell 64 in successive image frames.

In an alternative embodiment of the present invention, a replacement gate process is used that relies on a "dummy" gate of a sacrificial material for forming the implanted regions of the pixel sensor cell 64. In this instance, dummy gates are formed on the surface of semiconductor layer 10 at the intended location for the gate structure including gate dielectric 16 and gate electrode 40 and at the intended location for the gate structure including gate dielectric 18 and gate electrode 42. The dummy gates are formed before the implantations creating the charge collection well 52, pinning layer 50, floating diffusion region 54, and contact region 56 of pixel sensor cell 64 are executed as described above. Following formation of the implanted regions, the dummy gates are removed with an etching process. The gate electrodes 40, 42 and gate dielectrics 16, 18 are formed, as described above, at the respective intended locations formerly occupied by the dummy gates. The final structure may have approximately the same appearance as in FIG. 7.

Figure 8:
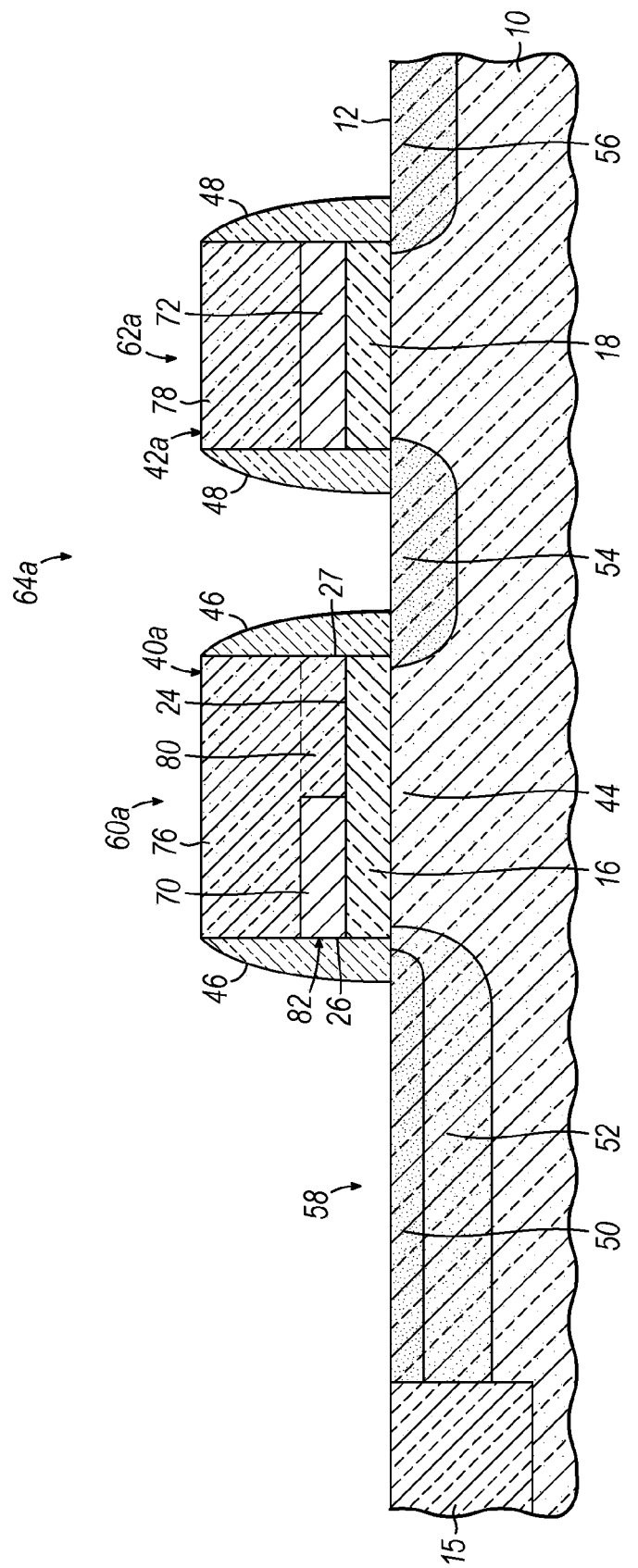
FIG. 8 is a cross-sectional view of a pixel sensor cell in accordance with an alternative embodiment of the invention.

With reference to FIG. 8 in which like reference numerals refer to like features in FIG. 7 and in accordance with an alternative embodiment, a gate electrode 40a of a gate structure 60a of a pixel sensor cell 64a includes a gate electrode section 70 that is formed from conductor layer 20 and a gate electrode 42a of a gate structure 62a of pixel sensor cell 64a includes a gate electrode section 72 that is also formed from conductor layer 20. The deposition and patterning of conductor layer 28 (FIGS. 5, 6) is omitted in this alternative embodiment. When the conductor layer 20 is patterned by etching, an island of resist is disposed in registration with a portion of the gate dielectric layer 16 and another island of resist is disposed in registration with gate dielectric layer 18. The former resist island is smaller in surface area than gate dielectric layer 16 and the latter resist island is commensurate in surface area with gate dielectric layer 18. Following etching, the gate electrode section 70 resides on the top surface 24 of the gate dielectric layer 16 and the gate electrode section 72 resides on the gate dielectric layer 18.

Next, the gate electrodes 40a, 42a are completed by forming gate electrode sections 76, 78, 80 from a different type of material than the material of gate electrode sections 70, 72. In particular, the gate electrode sections 76, 78, 80 are each comprised of a material having a lower work function than the material comprising gate electrode sections 70, 72. In one embodiment, the gate electrode sections 76, 78, 80 are comprised of polysilicon, which is characterized by a lower work function than the material of the gate electrode sections 70, 72. The gate electrode sections 76, 78, 80 may be formed by depositing a blanket layer of polysilicon by CVD using either silane or disilane as a silicon source, forming a patterned resist mask (not shown) on the blanket polysilicon layer, and using an anisotropic etching process to remove portions of the blanket polysilicon layer not masked by the patterned resist mask. The unmasked regions of the patterned resist mask are positioned laterally relative to the top surface 12 of semiconductor layer 10 in vertical registration with the gate dielectrics 16, 18.

The remainder of a pixel sensor cell 64a is fabricated as described above in connection with FIG. 7 to produce the final device structure of FIG. 8 that includes the gate electrodes 40a, 42a, the optional sidewall spacers 46, 48, the charge collection well 52, the pinning layer 50 for the charge collection well 52, the floating diffusion region 54, and the contact region 56 in the semiconductor layer 10. The gate electrode 40a and the gate dielectric 16 collectively define the gate structure 60a of the transfer gate for pixel sensor cell 64a. The gate electrode 42a and the gate dielectric 18 collectively define the gate structure 42a of the reset gate for pixel sensor cell 64a.

Similar to the gate conductor portion 32 (FIG. 7), the gate electrode section 80 occupies the space atop the top surface 24 of gate dielectric 16 in a juxtaposed relationship with the gate electrode section 70. Collectively, the gate electrode sections 70, 80 define a layer 82 of the gate electrode 40a. The material (e.g., polysilicon) of the gate electrode section 80 is characterized by a lower work function than the material of the gate electrode section 70, which endows the gate structure 60a with an asymmetrical threshold voltage. The portion of the gate structure 60a on the source side (i.e., the side nearest to the charge collection well 52 and that includes the gate electrode section 70) has a higher threshold voltage than the portion of the gate structure 60a on the drain side (i.e., the side more distant from the charge collection well 52 and including the gate electrode section 80). The threshold voltage asymmetry, which arises from the difference in work function between the materials used to construct the different gate electrode sections 70, 80 in layer 82 of the gate electrode 40a, improves the efficiency of the gate structure 60a because charge can be transferred from the charge collection well 52 to the floating diffusion region 54 without spilling back some fraction of the charge into the charge collection well 52 when the gate electrode 40a is turned off. The improved efficiency reduces lag and noise for the pixel sensor cell 64a in successive image frames.

Figure 9:
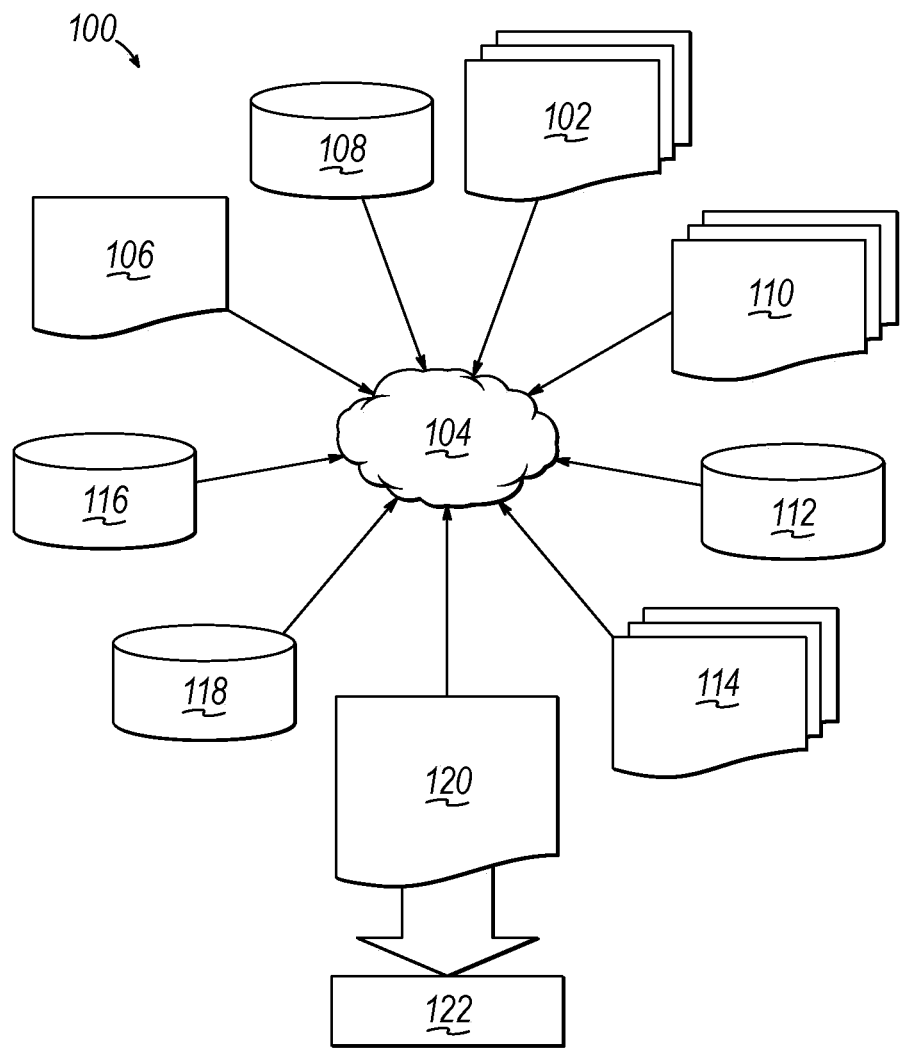
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 7 and 8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 7 and 8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7 and 8 to generate a Netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7 and 8. In one embodiment, design structure 120 may comprise a compiled, executable HDL simulation model that functionally simulates the devices shown in FIGS. 7 and 8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 7 and 8. Design structure 120 may then proceed to a stage 122 where, for example, design structure 120: proceeds to tape-out, is released to manufacturing, is released to a mask house, is sent to another design house, is sent back to the customer, etc.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for fabricating a pixel sensor cell, the method comprising:
   forming a photosensing element beneath a top surface of a semiconductor layer;
   forming a gate dielectric for a first gate structure on the top surface of the semiconductor layer;
   forming a first section of a gate electrode for the first gate structure on the gate dielectric and adjacent to the photosensing element; and
   forming a second section of the gate electrode for the first gate structure on the gate dielectric and in a juxtaposed relationship with the first section of the gate electrode as a first layer of the gate electrode,
   wherein the first section of the gate electrode is formed with a lateral position in the first layer between the photosensing element and the second section of the gate electrode, the second section of the gate electrode is comprised of a conductor, and the first section of the gate electrode is comprised of a first metal having a higher work function than the conductor comprising the second section of the gate electrode so that the first gate structure has an asymmetric threshold voltage.

2. The method of claim 1 further comprising:
   forming a floating diffusion region in the semiconductor layer.

3. The method of claim 2 wherein forming the photosensing element further comprises:
   forming a charge collection region of a pinned photodiode in the semiconductor layer and located beneath the top surface of the semiconductor layer,
   wherein the first gate structure is configured to control charge transfer from the charge collection region to the floating diffusion region.

4. The method of claim 1 wherein forming the first section of the gate electrode on the gate dielectric comprises:
   depositing a first conformal layer comprised of the first metal on the gate dielectric and the top surface of the semiconductor layer; and
   patterning the first conformal layer to form the first section of the gate electrode.

5. The method of claim 4 wherein the conductor is a second metal, and forming the second section of the gate electrode on the gate dielectric and in the juxtaposed relationship with the first section of the gate electrode as the first layer of the gate electrode comprises:
   depositing a second conformal layer comprised of the second metal on the gate dielectric, the top surface of the semiconductor layer, and the first section of the gate electrode; and
   patterning the second conformal layer to form the second section of the gate electrode.

6. The method of claim 5 wherein patterning the second conformal layer to form the second section of the gate electrode comprises:
   forming a patterned etch mask on a top surface of the second conformal layer and including an island at an intended location of the second section of the gate electrode; and
   etching the second conformal layer to remove portions of the second conformal layer that are unprotected by the island of the patterned etch mask.

7. The method of claim 5 further comprising:
   depositing a third conformal layer comprised of polysilicon on the top surface of the semiconductor layer, the first section of the gate electrode, and the second section of the gate electrode; and
   patterning the conformal polysilicon layer to form a second layer of the gate electrode that is separated by the first layer of the gate electrode from the gate dielectric.

8. The method of claim 4 wherein the conductor is comprised of polysilicon, and forming the second section of the gate electrode on the gate dielectric and in the juxtaposed relationship with the first section of the gate electrode as the first layer of the gate electrode comprises:

depositing a second conformal layer comprised of polysilicon on the top surface of the semiconductor layer and the first section of the gate electrode; and patterning the conformal polysilicon layer to form the second section of the first layer of the gate electrode and a second layer of the gate electrode that is separated by the first layer of the gate electrode from the gate dielectric.

9. The method of claim 4 wherein patterning the first conformal layer to form the first section of the gate electrode comprises:

forming a patterned etch mask on a top surface of the first conformal layer and including an island at an intended location of the first section of the gate electrode; and etching the first conformal layer to remove portions of the first conformal layer that are unprotected by the island of the patterned etch mask.

10. The method of claim 1 wherein the first section of the gate electrode and the second section of the gate electrode are each dimensionally smaller than the gate dielectric.

11. The method of claim 1 wherein the first section of the gate electrode is formed on the gate dielectric before the second section of the gate electrode is formed on the gate dielectric.

12. The method of claim 1 wherein the first metal is a transition metal, the conductor comprises a transition metal, the gate electrode includes a second layer comprised of polysilicon, and the first layer of the gate electrode is positioned between the second layer of the gate electrode and the gate dielectric.

13. The method of claim 1 wherein the first metal is a transition metal, the conductor comprises polysilicon, the gate electrode includes a second layer comprised of polysilicon, and the first layer of the gate electrode is positioned between the second layer of the gate electrode and the gate dielectric.

14. The method of claim 1 wherein the gate dielectric is comprised of a dielectric material having a dielectric constant in a range from 10 to 100.

15. The method of claim 1 further comprising:

before forming the gate dielectric, forming a dummy gate on the top surface of the semiconductor layer at an intended location for the gate dielectric; and after the dummy gate is formed, implanting the semiconductor layer to form a floating diffusion region on one side of the dummy gate.

16. The method of claim 15 wherein the photosensing element is a pinned diode, and forming the photosensing element in the semiconductor layer further comprises:

after the dummy gate is formed, implanting the semiconductor layer to form a charge collection region of the pinned photodiode in the semiconductor layer on an opposite side of the dummy gate from the floating diffusion region.

17. The method of claim 16 further comprising:

after the floating diffusion region and the charge collection region are formed, removing the dummy gate with an etching process.

18. The method of claim 1 further comprising:

forming a second gate structure on the top surface of the semiconductor layer.

19. The method of claim 18 further comprising:

implanting the semiconductor layer to form a floating diffusion region between the first gate structure and the second gate structure, wherein the photosensing element is separated from the floating diffusion region by a channel in the semiconductor layer beneath the first gate structure.

* * * * *